United States Patent
Bradley et al.

(10) Patent No.: US 6,647,536 B2
(45) Date of Patent: Nov. 11, 2003

(54) VLSI LAYOUT DESIGN JOBS SCHEDULING METHOD

(75) Inventors: Douglas Hooker Bradley, Austin, TX (US); Tai Anh Cao, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 231 days.

(21) Appl. No.: 09/737,340

(22) Filed: Dec. 15, 2000

(65) Prior Publication Data

US 2002/0078422 A1 Jun. 20, 2002

(51) Int. Cl.$^7$ .............. G06F 17/50; G06F 9/45; G06F 9/455
(52) U.S. Cl. .......... 716/1; 716/2; 716/8; 716/9; 716/11; 716/18
(58) Field of Search ............... 716/1, 2, 8, 9, 716/11, 18

(56) References Cited

U.S. PATENT DOCUMENTS 5,301,318 A * 4/1994 Mittal ..................... 716/11

OTHER PUBLICATIONS

Michael Bushnell et al., VLSI CAD Tool Integration Using the Ulysses Environment, 23rd ACM/IEEE Conference on Design Automation, pp. 55–61, Jun. 1986.*
Bushnell et al., Automated Design Tool Execution in the Ulysses Design Environment, IEEE Transactions on Computer–Aided Design of Integrated Circuits and Systems, pp. 279–287, Mar. 1989.*
R.A. Friedenson et al., Designer's Workbench: Delivery of CAD Tools, 19th Design Automation Conference, pp. 15–22, Jan. 1982.*
R. Juba et al., Production Improvements Using A Forward Scheduler, 17$^{th}$ IEEE/CPMT International Electronics Manufacturing Technology Symposium, pp. 205–209, Oct. 19999999995.*
J. Sienicki et al., Graphical Methodology Language for CAD Frameworks, 7th International Conference on VLSI Design, pp. 401–406, Jan. 1994.*
W. Allen et al., The MCC CAD Framework Methodology Management System, 28$^{th}$ ACM/IEEE Design Automation Conference, pp. 694–698, Jun. 1991.*

* cited by examiner

Primary Examiner—Matthew Smith
Assistant Examiner—A. M. Thompson
(74) Attorney, Agent, or Firm—Richard F. Frankeny; Winstead Sechrest & Minick P.C.; Casimer K. Salys (57) ABSTRACT

A method for automatically running a plurality of interactive programs that are necessary to complete a VLSI design and verification is disclosed. Layout data is completed and saved. Multiple programs of the VLSI logic are launched using this data. The submission of design programs (jobs) operate as program "states" with each program state having data inputs, data outputs possibly receiving logic inputs and generating logic outputs. The data inputs and data outputs may be conditional in that they were generated from other program states that may not have executed error free. Logic routines generate the logic signals which are logic combinations of the generated logic outputs and these logic signals may be used to launch other program states. Once the method is started, a designer simply corrects errors that occur and then re-starts the design process. The method keeps unconditional outputs of program states and updates conditional outputs and the program states execute until the VLSI design and verification is completed.

26 Claims, 9 Drawing Sheets

VLSI LAYOUT DESIGN JOBS SCHEDULING METHOD

CROSS REFERENCE TO RELATED APPLICATIONS

The present invention is related to U.S. patent application Ser. No. 09/737,332 which is hereby incorporated by reference herein.

TECHNICAL FIELD

The present invention relates in general to a method for scheduling the running of layout design verification programs (jobs) for a Very Large Scale Integration (VLSI) chip design.

BACKGROUND INFORMATION

In the following, several VLSI layout design programs will be discussed. The detailed specific nature of all these program is not necessary to understand the environment for the present invention. These programs may be referred to as simply "jobs" in this Specification.

In order to understand the following description, it is useful to review the present VLSI design job environment. The following is a legend of some VLSI layout programs that are used in embodiments of the present invention:

DRC—is a design rules checking program

LVS—is a checking program for Layout versus the Schematic

Yield—is a program that predicts yields based on a layout

Power—is a power analysis program

Pathmill—is a vendor transistor level static timing program

Einschk—is a circuit checking program

EinTLT—is a transistor level timing program

Harmony—is a noise analysis tool

Noise Dracula LPE/PRE—parasitic extraction tools that analyze the layout data and create noise (cross coupled capacitance) Spice netlists Timing Dracula LPE/PRE—parasitic extraction tools that analyze layout data and create timing (resistance and capacitance) Spice netlists Boundary Check—is a design rules checking program between macros Create Abstract—creates physical representation of design Create Blockage—checks if the Abstract is still valid After a VLSI layout is completed, the designer may need to determine that the layout macro passes various verification programs (e.g., LVS, DRC, and Boundary Check) before extraction programs are run to generate timing/noise net lists. The expected yield of the VLSI chip, represented by the layout, may also be checked at this stage by running a Yield program.

Figure 4:
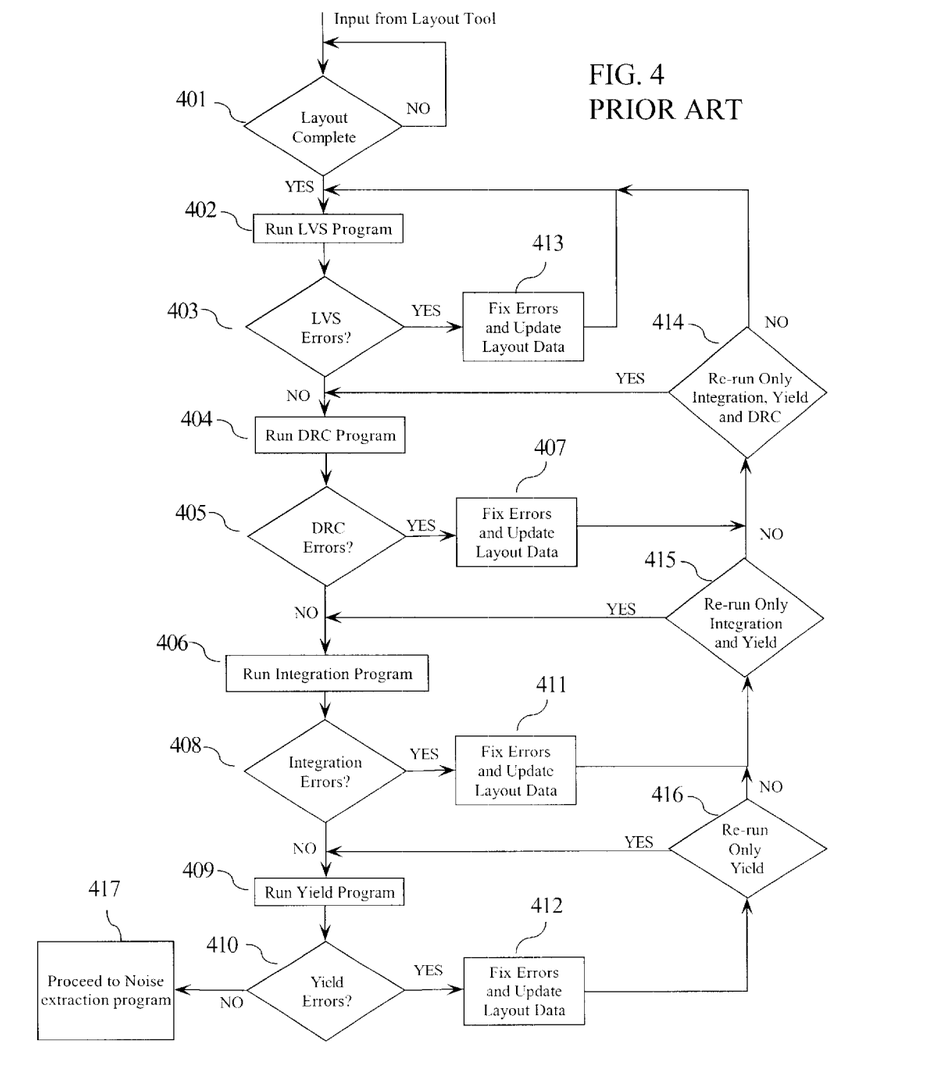
FIG. 4 is a p prior art flow diagram illustrating how VLSI layout programs may be executed in a manual serial mode.

Normally, the VLSI layout designer discretely and manually submits these jobs in series or parallel. FIG. 4 is a flow diagram where these four jobs are submitted in a series mode. The designer completes one job before going to another job. For example, after the designer completes the VLSI layout in step 401, the LVS program is executed in step 402. A test is done in step 403 to determine if LVS has errors. If the result of the test in step 403 is YES, then the errors are fixed in step 413 by the designer and the LVS program is run again by branching to step 402. If the result of the test in step 403 is NO, then the next program, DRC, is run in step 404. A test is done in step 405 to determine if DRC has errors. If the result of the test in step 405 is YES, then the errors are fixed by the designer and a branch is made to a test in step 414 to determine if only some of the program set are to be rerun. If the test in step 414 is NO, then step 402 runs the program set from the beginning. If the result in step 414 is YES, then the program set starts at the DRC program in step 404. If the result of the test in step 405 is NO, then the Integration program is run in step 406. A test is done in step 408 to determine if the Integration program has errors. If the result of the test in step 408 is YES, then the errors are fixed in step 411 and then in step 415 a test is run to determine if only some of the programs are to be rerun. If the result in step is NO, then step 414 executes the test as described earlier. If the result in step 415 is YES, then the program set is rerun starting at the program Integration in step 406. If the result of the test in step 408 is NO, then the Yield program is run in step 409. A test is then run in step 410 to determine if the Yield program had any errors. If the result of the test in step 410 is YES, then the errors are fixed in step 412 and then a test is run in step 416 to determine if only the Yield program is to be rerun. If the result of the test in step 416 is NO, then the tests in steps 415 and 414 are run as explained earlier. If the result of the test in step 416 is YES, then the program set is rerun starting at the Yield program. If the result of the test in step 410 is NO, then the execution of layout programs may branch to a noise model extraction program (e.g., Noise Dracula LPE/PRE) in step 417.

In a parallel program execution mode, the designer submits the exemplary four layout design jobs (e.g., DRC, LVS, Integration and Yield are executed concurrently) in parallel. If any one of the jobs fails, the designer has two options. The first option is to cancel the remaining incomplete jobs so the designer may fix the problems associated with one design program at a time. A second option is to let the remaining uncompleted jobs run to completion. The designer then may analyze the results of the completed jobs and attempt to fix errors in all the jobs at the same time. In either option, the process repeats itself until all jobs are error free.

Either in series or parallel mode, the designer has to discretely and manually submit and cancel the jobs. In order to do so, the designer needs to keep track of all of the jobs submitted. For example, after DRC, LVS, Boundary Check, and Yield programs are error free, the next step is to generate the timing/noise net lists. In order to accurately account for the global wiring over the macro, an Abstract that is consistent with the macro wiring is created. An extraction program uses the created Abstract to form a possible global wiring over the macro. The macro is then extracted with that global wiring. One can see that before an extraction is run, either an Abstract already exists or if the Abstract is present it must reflect an associated macro wiring.

In the prior art, submitting the VLSI design jobs is very much a sequential, step-by-step, and manual process, where the process flow is directed by an individual designer. There is, therefore, a need for a method to automatically submit VLSI design jobs to simplify the designer's task and allow VLSI design and verification to proceed more quickly.

SUMMARY OF THE INVENTION

The VLSI layout design task comprises a set of design programs or jobs that are run on data created by a designer. To streamline the VLSI design and verification process, the necessary or desired design programs are organized like machine states which are interconnected with a program (job) scheduler. The different programs become program states within the design process with different criteria determining transitions between the program states. The different programs have program data inputs and program output data, either from an initial database or from other programs in the process flow. Programs also have program logic outputs and inputs which may indicate if the programs have completed error free, completed conditionally, or have output data that is conditionally or unconditionally valid. Other logic routine states are created within the scheduler wherein the program logic outputs from the programs are used to determine additional logic routine outputs which in turn are used to launch, cancel, or otherwise modify programs within the process. When the design process is initiated, a set of programs may run until the first program, which fails or becomes interrupted because of errors, stops or interrupts other incomplete programs. The designer then may correct the errors of the first failed program. The designer restarts the design process and the scheduler begins in the suspended state generating new outputs for the interrupted first program and other previously incomplete programs. Embodiments of the invention may complete programs with conditional inputs to complete a design pass and create a database that is known to have errors. The transitions between the program and logic routine states are rule based and take paths dependent on designer input for designer controls and program and logic routine outputs. However, the designer does not have to keep track of which programs have been submitted. Rather, the designer corrects errors in one or multiple programs as desired and enters new data and the program execution is controlled by the scheduler. The designer may start the design process under various operational modes. These operational modes, such as Audit Mode, Non Audit Mode and Edit Mode, may alter conditions that determine transitions between the program states.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like may have been omitted in as much as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Embodiments of the present invention disclose a method of submitting layout related VLSI design jobs in what may be termed "one button clicking". All the jobs, which are submitted on different load leveler machines, are automatically tracked and managed by the software scheduling program. A load leveler machine is one where layout design programs are executed by multiple users.

In embodiments of the present invention, different modes are used during the VLSI layout design process, for example, the Audit Mode and the Non-Audit Mode. The purpose of Audit Mode is to guarantee the consistency, validity, and coherence of the database. The designer wants to make sure that the decision to "tape out"(release to manufacturing) of the layout is based on absolutely correct data. The design programs must all have been run without errors at the time of tape out. The following examples illustrate the importance and the operation of the Audit Mode.

One of the important criteria of microprocessor design is the frequency of which the microprocessor tape out has to be re-done. As an illustration, the microprocessor chip timing is run by a program, Einstimer, using New Delay Rules (NDR). NDRs, in turn, are generated by a program Pathmill or EinsTLT running on the extracted timing Spice (circuit simulation program) netlists. A timing Spice netlist is in turn generated from the layout. Assume that at some point during the design process all the design programs have run error free and for some reason the DRC checking data is modified to accommodate a small design rule change (e.g., from the makers for a chip mask). When the Audit Program is run on the entire database, it will determine that there is inconsistency between the official DRC checking data and the checking data used to run DRC on a particular macro. The Audit Program will now assign a "no pass" or error to the DRC which was run on that macro, thus rendering the whole database invalid. In order to restore the database, DRC is run again on the macro. If DRC fails, then the layout has to be modified forcing every program in the design program set to be rerun. The Audit Mode is very strict, all programs must run error free and the database must check valid in its entirety.

As another example, assume that at some point in the design process, all the program runs are error free. If for some reason the layout is opened in an Edit Mode, an Audit Program will find an inconsistency between the dates. The Audit Program defaults to a condition where it is assumed that since the Edit Mode was opened something may have been changed. The Audit Program will invalidate the database forcing all the layout based programs to be rerun.

Near the tape-out phase, all the design jobs are run in an Audit Mode to check the validity of the database. Once a design has reached the tape-out phase, every check should have been run successfully at least once. Therefore all the inputs, correct or not correct, have already been generated. However, past experience indicates that all the design jobs are rerun many times until the completion of tape-out (layout) because of small changes in layout, cell libraries or checking results. It is desirable for the designer to have a quick turn-around time when doing design job reruns because of these small changes. The Audit Mode environment is very suitable for use of a program job scheduler process according to embodiments of the present invention. Since all the checks are to be rerun, most of them are likely to pass. It should be noted that if the jobs are run in Audit Mode and later canceled, their outputs are not promoted to the release area (database defining a final layout).

The VLSI layout design process may also be run in the Non-Audit Mode. In this mode, layout design programs which produce an error may be allowed to complete producing conditional outputs and logic signals which signal that outputs are conditional. For example a Design Rules Check (DRC) program may fail but a timing extraction and possible other subsequent programs may continue provided that a lesser quality "tag" is attached to all conditional outputs produced by the programs.

Figure 8A:
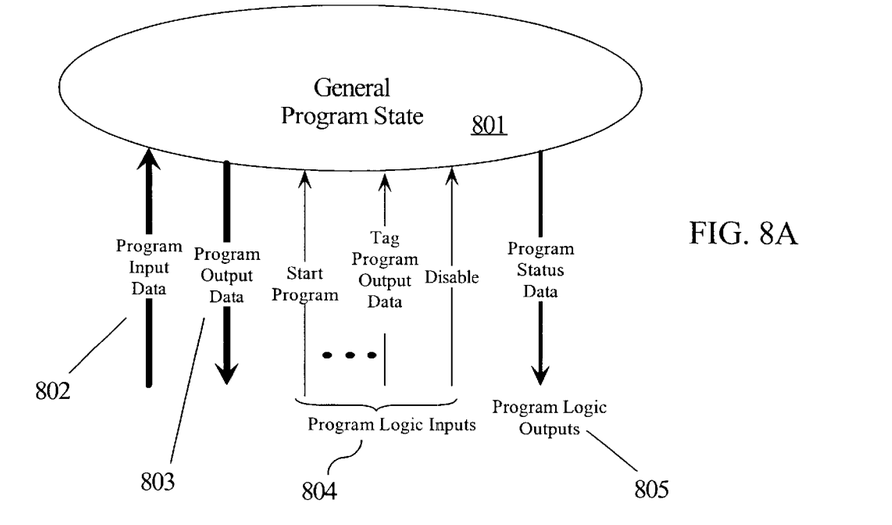
FIG. 8A illustrates inputs and outputs of a generalized program state.
Figure 8B:
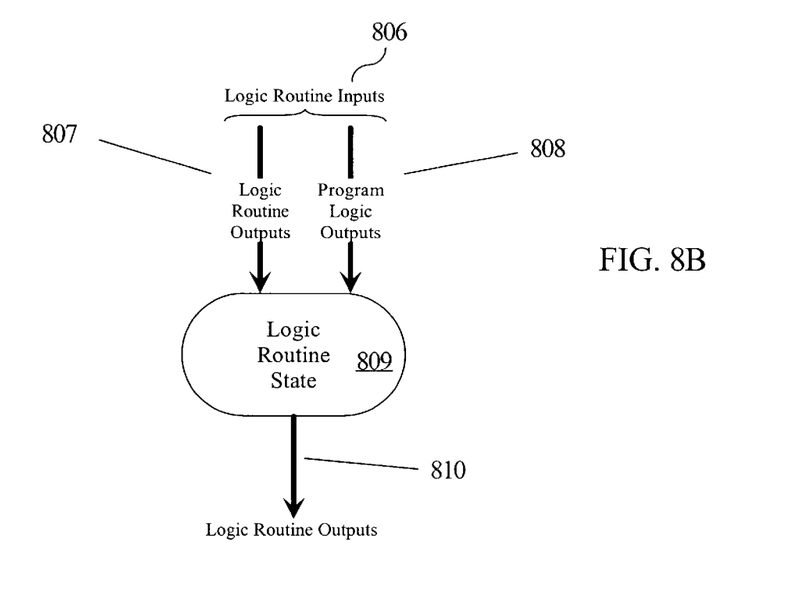
FIG. 8B illustrates inputs and outputs of a generalized logic routine state.

FIGS. 8A and 8B illustrate elements used in embodiments of the present invention. Layout design programs (e.g., DRC) are referred to as program states. A generalized program state 801 is shown in FIG. 8A. Each generalized program state, like program state 801, has inputs and outputs. The exemplary input to a program state comprise Program Input Data 802, Program Output Data 803 and Program Logic Outputs 805 and Program Logic Inputs 804. The Program Input Data 802 comprises selected data from the Layout database necessary for a particular program to execute. The Program Output Data 803 is the result of the execution of the particular program. The Program Logic Inputs 804 comprise inputs that control the execution in a particular program state (e.g., Start Program, Stop or Disable program, and Tag the Program Output Data 803 for a particular execution pass).

Figure 7:
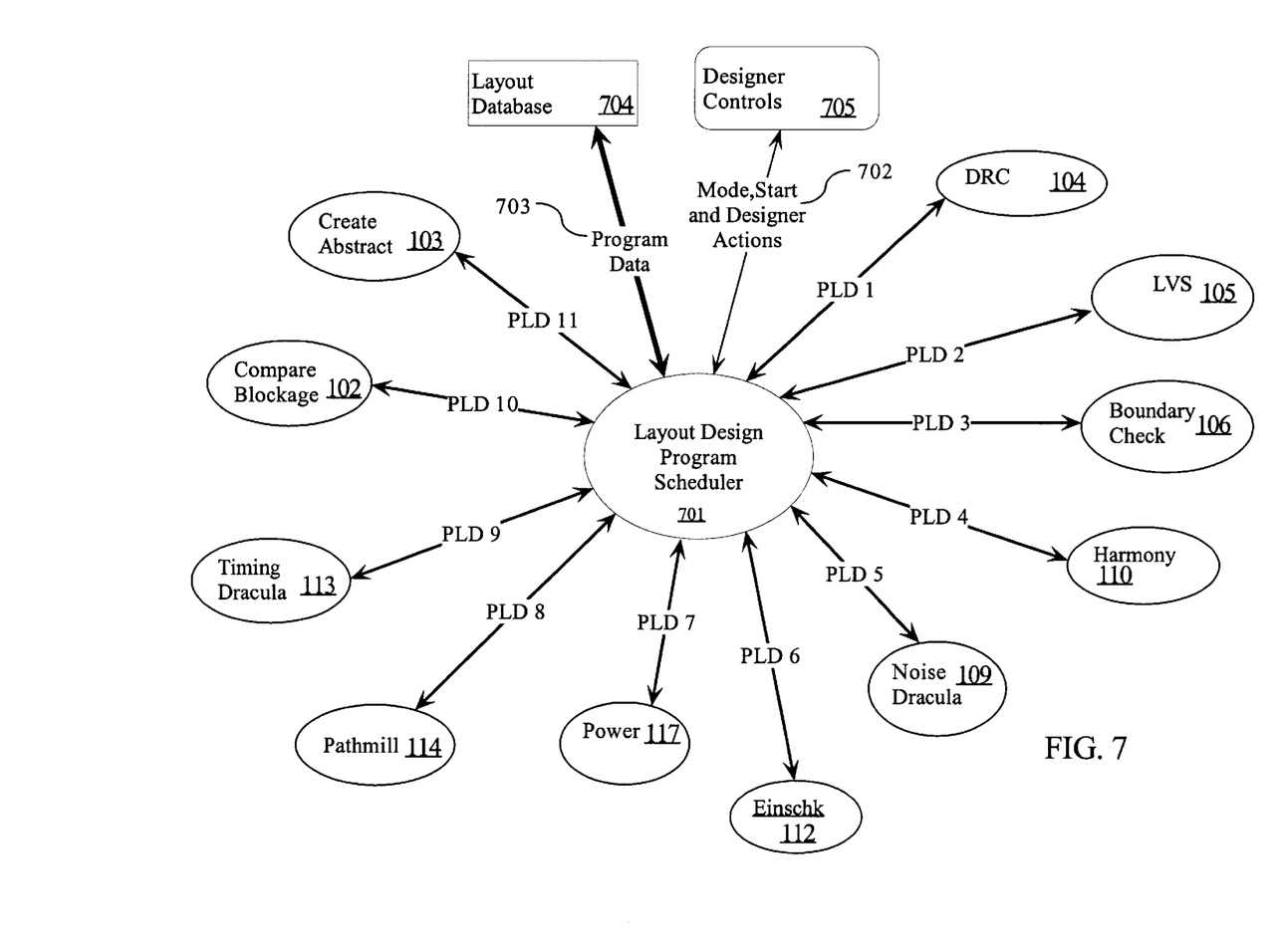
FIG. 7 is a diagram illustrating the program states, designer controls, layout database and their connection paths to the program scheduler.

FIG. 8B illustrates a Logic Routine State 809 which comprises part of the Program Scheduler 701 (see FIG. 7). The Logic Routine States 809 receive Program Logic Outputs 808 and Logic Routine Outputs 807 and generate other Logic Routine Outputs 810. The Logic Route States 809 are used by the Program Scheduler 701 to determine when and under what conditions to launch program states based on the Program Logic Outputs 805 from particular program states 801.

FIG. 7 is a diagram illustrating the connections of various specific program states used in embodiments of the present invention, Designer controls 705 and Layout Database 704 couple data and signals to the Program scheduler 701. The Designer controls 705 comprise signals from a designer to the Program Scheduler 701 (e.g., Mode settings, start, and actions the designer may take concerning the executions of various Program states). Each of the Program states, DRC 104, LVS 105, Boundary Check 106, Harmony 110, Noise Dracula 109, Einschk 112, Power 117, Pathmill 114, Timing Dracula 113, Compare Blockage 102 and Create Abstract 103 are coupled to the Program Scheduler 701 with a Program Logic and Data (PLD) connection. All of the communication between the various program states goes through the Program Scheduler 701. The Program Scheduler 701 receives the status of each program state and the status of their Program Output Data. The Program Scheduler 701 then determines which programs to launch based on the mode setting from the Designer controls 705 and the Program Logic Outputs which indicate the execution status and program output status of each program state. The PLDs of each of the program states illustrated in FIG. 7 is indicated by PLD 1 through PLD 11.

Figure 1:
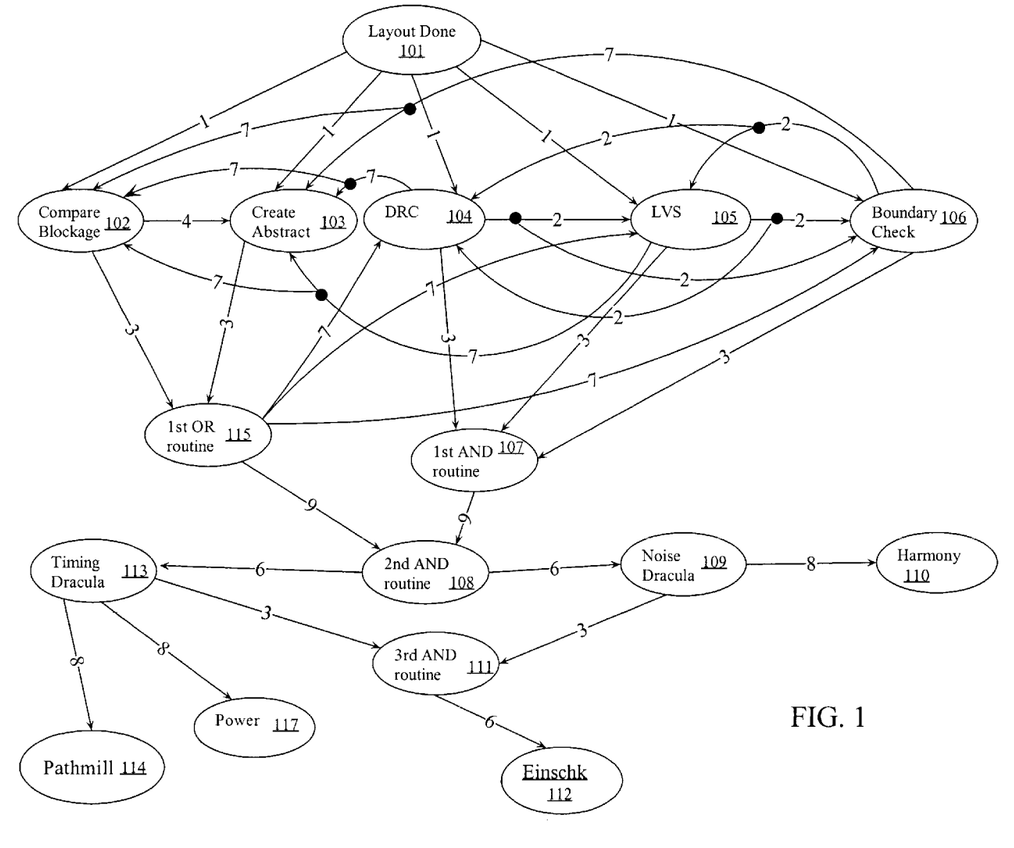
FIG. 1 is a state diagram showing program states and conditions for transitions between program states when program flow is dispatched according to an embodiment of the present invention.

FIG. 1 is a program state diagram used to illustrate one embodiment of the present invention. The program state diagram is used to illustrate the many paths and different conditions in which layout design programs may execute. The program state diagram in FIG. 1 may be thought of as having three stages:

1. Stage 1 consists of running program states DRC 104, LVS 105, Boundary Check 106, Create Abstract 103, and Compare Blockage 102.
2. Stage 2 consists of program states of Timing Dracula 113 and Noise Dracula 109.
3. Stage 3 consists of running program states Pathmill 114, Einschk 112, Harmony 110, and Power 117.

FIG. 1 is primarily a design program state diagram illustrating the possible paths of design program (program state) execution during a VLSI layout design process according to embodiments of the present invention. Logic routine states are also used to illustrate decisions the program scheduler 701 uses to control transitions between program states. These logic routine states may have inputs that depend on a logic decision concerning the execution of multiple other programs states. Paths between various program states or logic routine states are illustrated in FIG. 1 by including a number superimposed on each path arrow. In the program state diagrams (e.g., FIG. 1), used to illustrate transitions between program states, only one condition is shown that determines transitions from any one program state to another program state. It should be understood that other conditional signals or data may be passed from one program state to another depending on selected modes (e.g., Audit Mode) under which the program scheduler 701 may run. The showing of one condition illustrates the primary decision for a transition and is the only one shown so the diagram does not become too busy thereby inhibiting an understanding of the invention.

The following legend explains these primary conditions which are associated with the numbers in parenthesis. These primary conditions may determine transition paths used in the following embodiments of the present invention.

(1)—unconditional launch of the program state (2)—if the source program state failed, disable the receiving program state (3)—if the source program state passes criteria, send a logic true to logic state (4)—if the source program state passes, disable the receiving program state (5)—if the source program state fails, execute a no operation (NOP)

(6)—if logic output is a logic true, launch the receiving program state (7)—if the source program state failed, (optionally) disable the receiving program state (8)—if the source program state passes, unconditionally launch (9)—send a logic signal based on logic of logic routine and logic inputs (10)—validate the results of a program state if true (11)—if logic output false, tag results as degraded (12)—send a logic if source program state passes with conditional results (13)—if source program state passes, launch with conditional results (14)—if logic state is true, launch with conditional results The set of programs (program states) in FIG. 1 are essentially governed by a set of rules which determine the many possible transitions between the program states whose execution finally result in a complete layout.

Since a designer may choose to correct all or some errors resulting from design program runs, many different paths through the programs states, illustrated in FIG. 1, are possible before a VLSI layout design process is complete. The following illustrates exemplary paths in a VLSI layout design process according to embodiments of the present invention. "State" may be used to refer to a "program state" or the actual execution of a program residing in that state.

A completed layout is the basis to begin in a Layout Done state 101 from which the following design programs (jobs), DRC 104, LVS 105, Boundary Check 106, Compare Blockage 102 and Create Abstract 103 may be launched (paths 1) simultaneously. Some of these jobs may complete before others. For example, consider three of these jobs, DRC 104, LVS 105, and Boundary Check 106. A failure in any of these three jobs fails may result in the other remaining jobs being canceled (e.g., path 2 or optional path 7) by actions of the program scheduler 701. The designer may select the job which fails first and then elect to fix the errors related to that job. At that point the remaining of the program states, which have attempted a first execution, are in a canceled state. The designer may restart the process after fixing the errors in the first failed program state and then determine if the same or a different program state fails or all programs run to completion. The designer may iterate this process (by initiating a start) until all three program states (in this example) run error free. In this example, the three jobs DRC 104, LVS 105, and Boundary Check 106, each have a logic (paths 3) output which is coupled to AND Logic routine 107. AND logic routine 107 generates a Logic routine output (path 9) which is coupled to a second AND logic routine 108 which in turn generates multiple outputs (paths 6) to Timing Dracula 113 and Noise Dracula 109.

The failure of Compare Blockage 102 means an Abstract for the layout needs to be generated. Therefore, its success means stopping (path 4) Create Abstract 103 (a new Abstract is not needed) and the same time sending a logic signal (path 3) to the first OR routine 115 which sends a Logic routine output signal (path 9) to second AND routine 108. Likewise, a failure of Compare Blockage 102 will allow Create Abstract 103 to continue to run until it passes at which time it sends a logic true signal (path 3) to first OR routine 115. The output of first OR routine 115 (path 9) and the output first AND routine 107 (path 9) are sent to the second AND routine 108. The outputs the second AND routine 108 (paths 6) will determine the launching of programs, Timing Dracula 113 and Noise Dracula 109.

As seen above, the launching of the programs (Timing Dracula 113 and Noise Dracula 109) which generate extracted timing/noise net lists, is determined by the outputs (paths 9 and paths 6 respectively) of the first OR routine 115, first AND routine 107 and second AND routine 108. When Timing Dracula 113, which generates an extracted timing net list, is completed it launches programs (paths 8) called Pathmill 114 and Power 117 and at the same time Timing Dracula 113 sends a logic signal (path 3) to the third AND routine 111. When Noise Dracula 109 is completed, it launches (path 8) a program Harmony 110 and at the same time it sends a logic signal (path 3) to third AND routine 111. The output of the third AND routine 111 (path 6) determines the launching of the program Einschk 112.

As stated earlier, the layout design process may have different modes under which the layout design programs are run. The Audit Mode and Non Audit Mode are two such modes. Since the designer may have different goals at different stages in the design, the design modes allow the designer to alter the conditions under which the program states make transitions to other program states. However, embodiments of the present invention embed these conditions and the signaling between program states within the program scheduler 701 so that the designer need only "single click" a restart of the process after errors are corrected. The program states, depending on the design mode, retain program output data and program logic outputs indicating the status from a previous execution. The status of programs or program states determines if particular programs need to be rerun, if program output data is error free or conditional, and which programs may be launched in parallel. The designer does not have to keep track of the different programs that need to be run. The designer need only determine under which mode to do the layout design process and to correct errors that occur It can be seen from above that the running time of the whole process, (illustrated in FIG. 1) from beginning to the end, depends on the longest program run times of programs in the three process stages. This may be stated in equation form in the following:

Running Time=Stage 1 (longest run time)+Stage 2 (longest run time)+Stage 3 (longest run time)

The flow through the state diagram illustrated in FIG. 1 and explained above is only one embodiment of the present invention. Other conditions may be used to transition between program states and other logic route states may be used to determine which programs must have completed (error free or condition) before other programs states are launched. The various conditions may also be changed in response to the designer selected modes for the layout design process.

Figure 2:
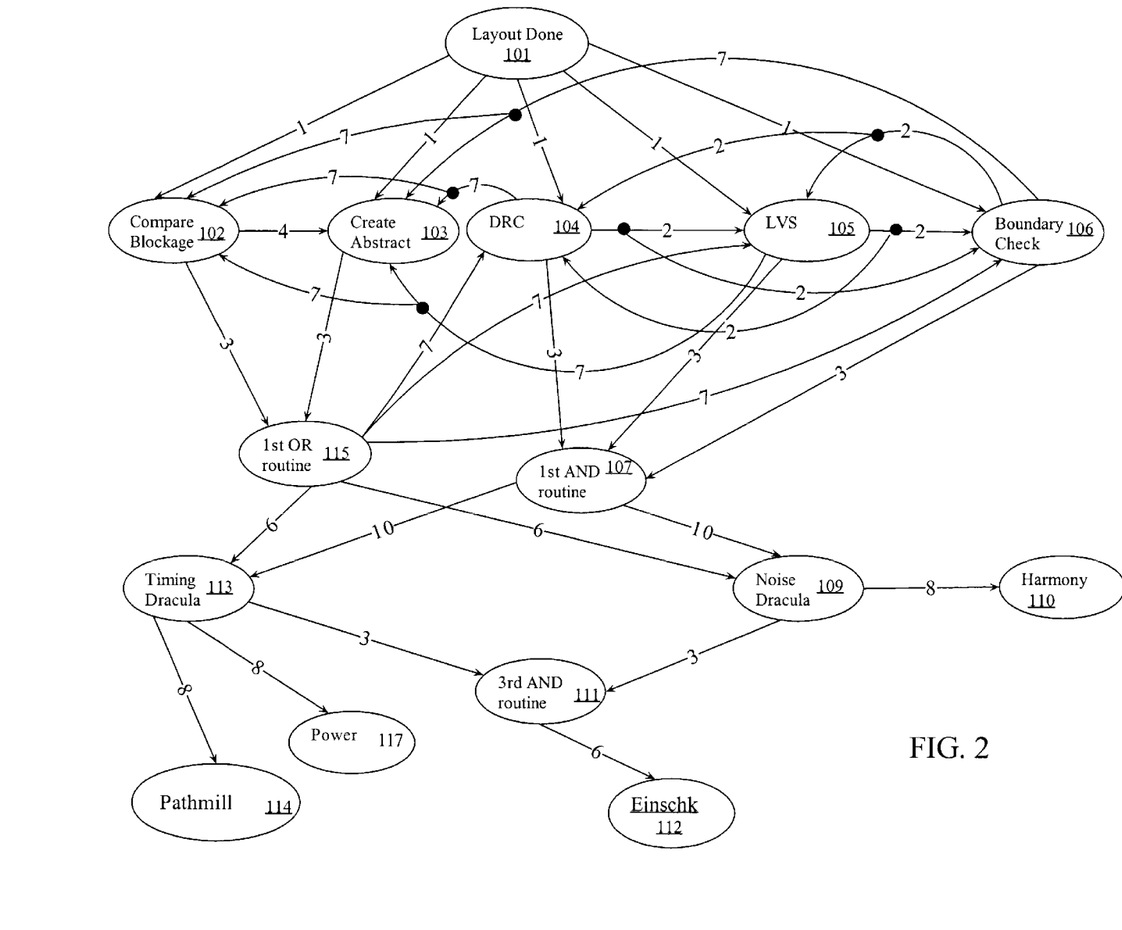
FIG. 2 is a state diagram showing program states and conditions for transitions between program states when program flow is dispatched according to another embodiment of the present invention.

FIG. 2 illustrates modifications (made by designer controls setting execution modes) to the program states of FIG. 1 in another embodiment of the present invention. In FIG. 2, the output (paths 6) of the first OR routine 115 may directly determine the launching of Timing Dracula 113 and Noise Dracula 109. In this case, the output from the first AND routine 107 is used to only validate (paths 10) the results of Timing Dracula 113 and Noise Dracula 109 or attach a quality assessment "tag" to these generated net lists. The running of Stage 1, in this case, depends only on the programs Compare Blockage 102 or Create Abstract 103 which send signals (paths 3) to first OR routine 110. The output (paths 6) of first OR routine 110 determines the transition to Stage 2 comprising the programs Timing Dracula 113 and Noise Dracula 109.

Figure 3:
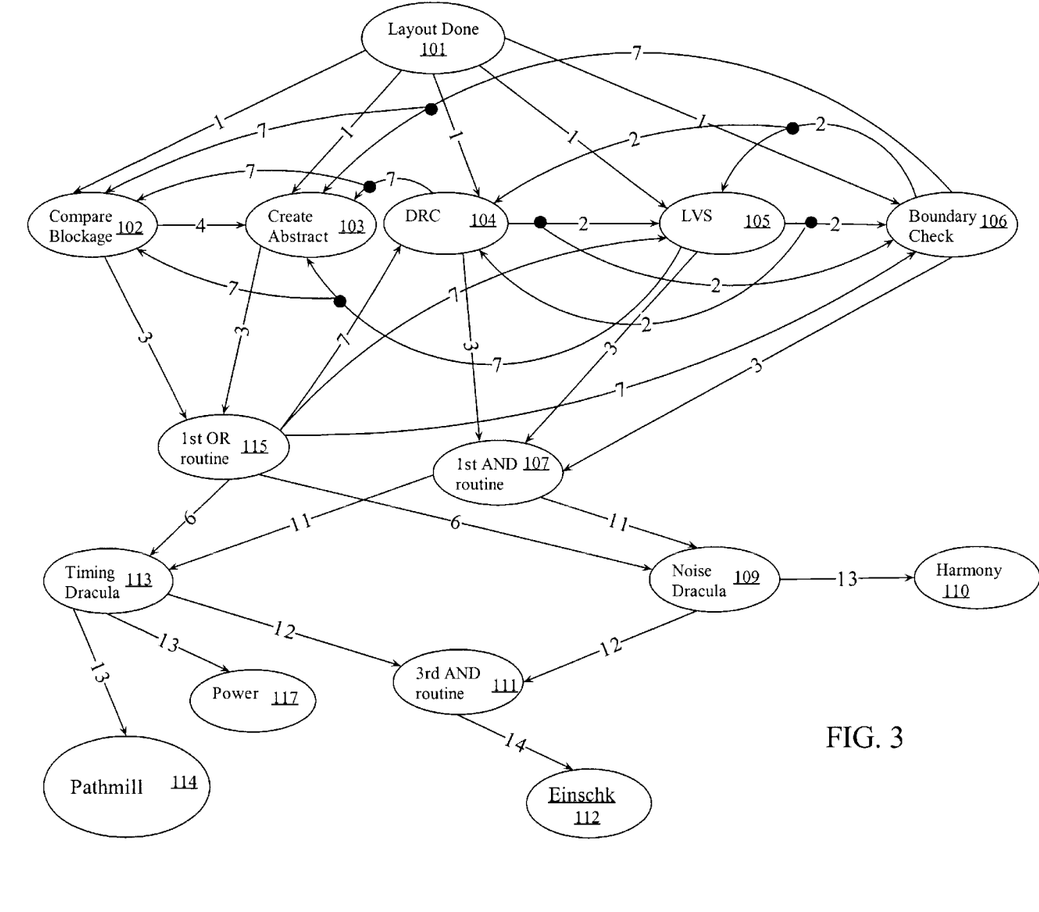
FIG. 3 is a state diagram showing program states and conditions for transitions between program states when program flow is dispatched according to another embodiment of the present invention.

FIG. 3 illustrates another embodiment of the present invention. In this embodiment, if any of programs DRC 104, LVS 105, Boundary Check 106 fail(s), as indicated by a false output (path 11) from first AND routine 107, Timing Dracula 113 and Noise Dracula 109 are allowed to complete, but the results are "tagged" as having a degraded quality. In this embodiment of the present invention, Timing Dracula 113 and Noise Dracula 109 also generate conditional logic signals (path 12) to third AND routine 111 indicating successful completion but with degraded results. Programs Harmony 110, Pathmill 114, and Power 117 would receive conditional launch signals (paths 13) and Einschk 112 would receive a conditional logic signal (14) indicating that it also is being conditionally launched. The subsequent outputs of programs Pathmill 114, Einschk 112, Harmony 110, and Power 117 also may have degraded quality. This embodiment allows all programs to run in order to generate a database and subsequent runs will continue until all results (program output data) are unconditional.

Figure 5:
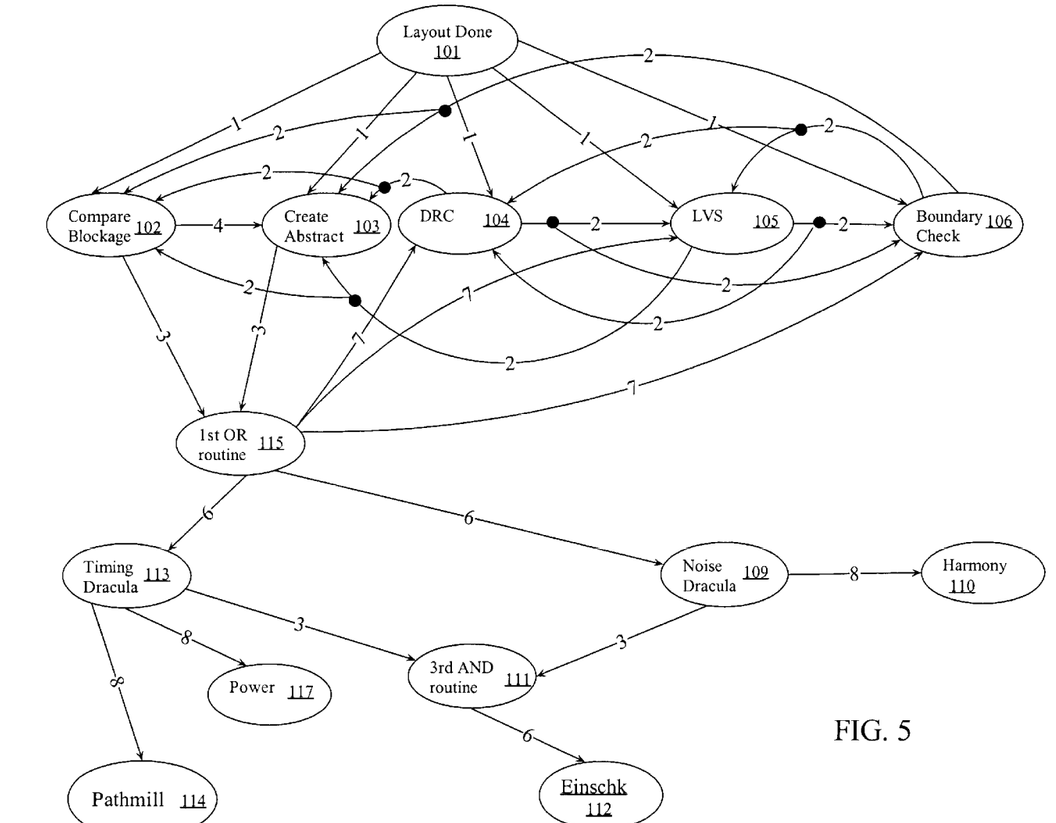
FIG. 5 is a state diagram showing program states and conditions for transitions between program states when program flow is dispatched according to another embodiment of the present invention.

FIG. 5 is another embodiment of the present invention similar to the embodiment in FIG. 3. In FIG. 5, only the signals (paths 3) from Compare Blockage 102 and Create Abstract 103 are used as inputs to first OR routine 115. The outputs (paths 6) of first OR routine 115 are used to launch Timing Dracula 115 and Noise Dracula 109. This embodiment relies on the successful running of DRC 104, LVS 105 and Boundary Check 106 to allow Compare Blockage 102 and Create Abstract 103 to generate enabling signals (paths 3) to launch other programs. The conditional paths (7) from Boundary Check 106, DRC 104 and LVS 105 to Compare Blockage 102 and Create Abstract 103 have been changed to disable if failed (paths 2) in FIG. 5.

Figure 6:
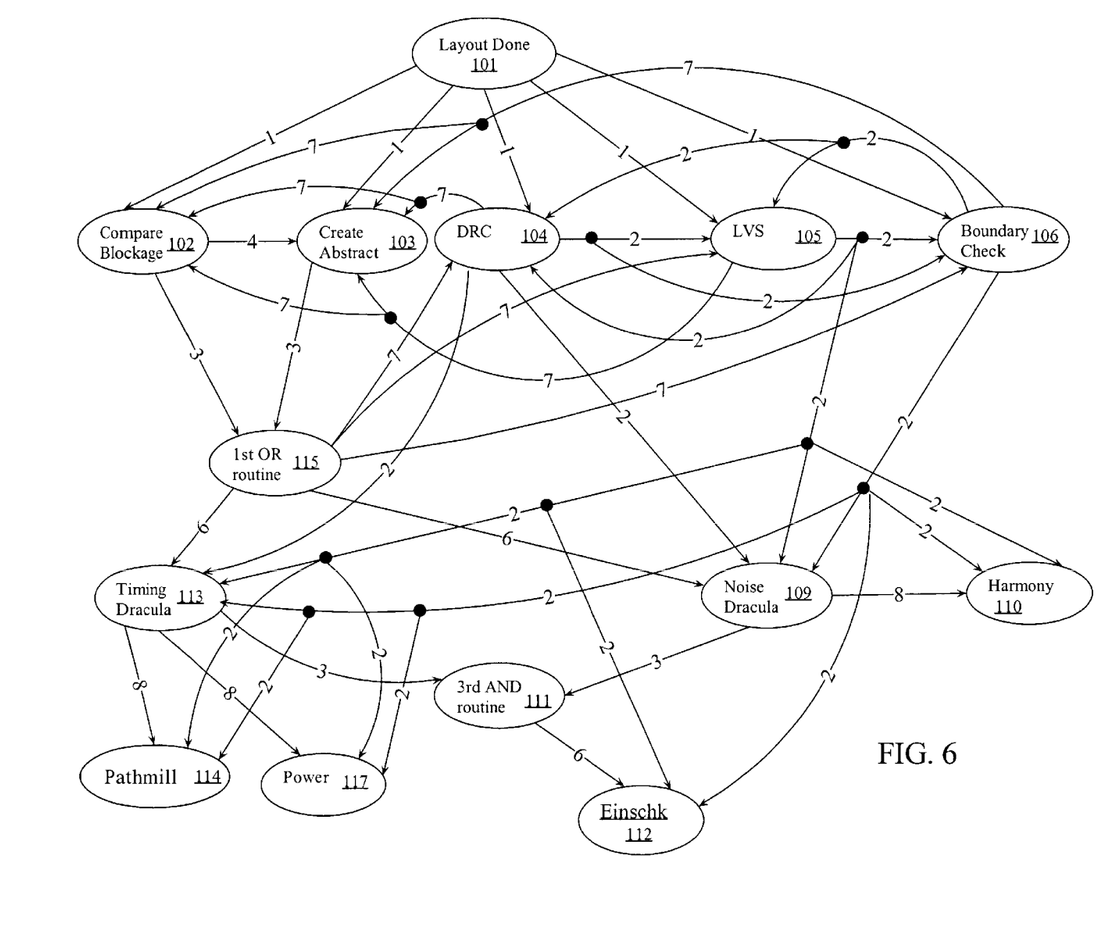
FIG. 6 is a state diagram showing program states and conditions for transitions between program states when program flow is dispatched according to another embodiment of the present invention.

FIG. 6 is a state diagram of another embodiment of the present invention where the first AND routine 107 and second AND routine 108 have been disabled (therefore not shown). In the embodiment in FIG. 6, Compare Blockage 102 and Create Abstract 103 are controlled by signals (paths 7) from each of DRC 104, LVS 105 and Boundary Check 106. Any one of these programs failing may (optionally) disable Compare Blockage 102 and Create Abstract 103. DRC 104, LVS 105 and Boundary Check 106 each send a signal (paths 2) to DRC 104, LVS 105 and Boundary Check 106. Timing Dracula 113 and Noise Dracula 109 will launch with successful completion of Compare Blockage 102 or Create Abstract 103 unless DRC 104, LVS 105 or Boundary Check 106 fails, in which case their signals (paths 2) will disable Timing Dracula 113 and Noise Dracula 109. Disabling Dracula 113 and Noise Dracula 109 would normally also prevent the programs they enable from being launched. However, Dracula 113 and Noise Dracula 109 may launch Stage 3 programs (Pathmill 114, Power 117, Einschk 112 and Harmony 110) before a failure occurs in DRC 104, LVS 105 or Boundary Check 106. To prevent the Stage 3 programs from completing all of the Stage 3 programs also receive a signal (paths 2) from DRC 104, LVS 105 and Boundary Check 106 which disables them in the event any failure of these programs.

Figure 9:
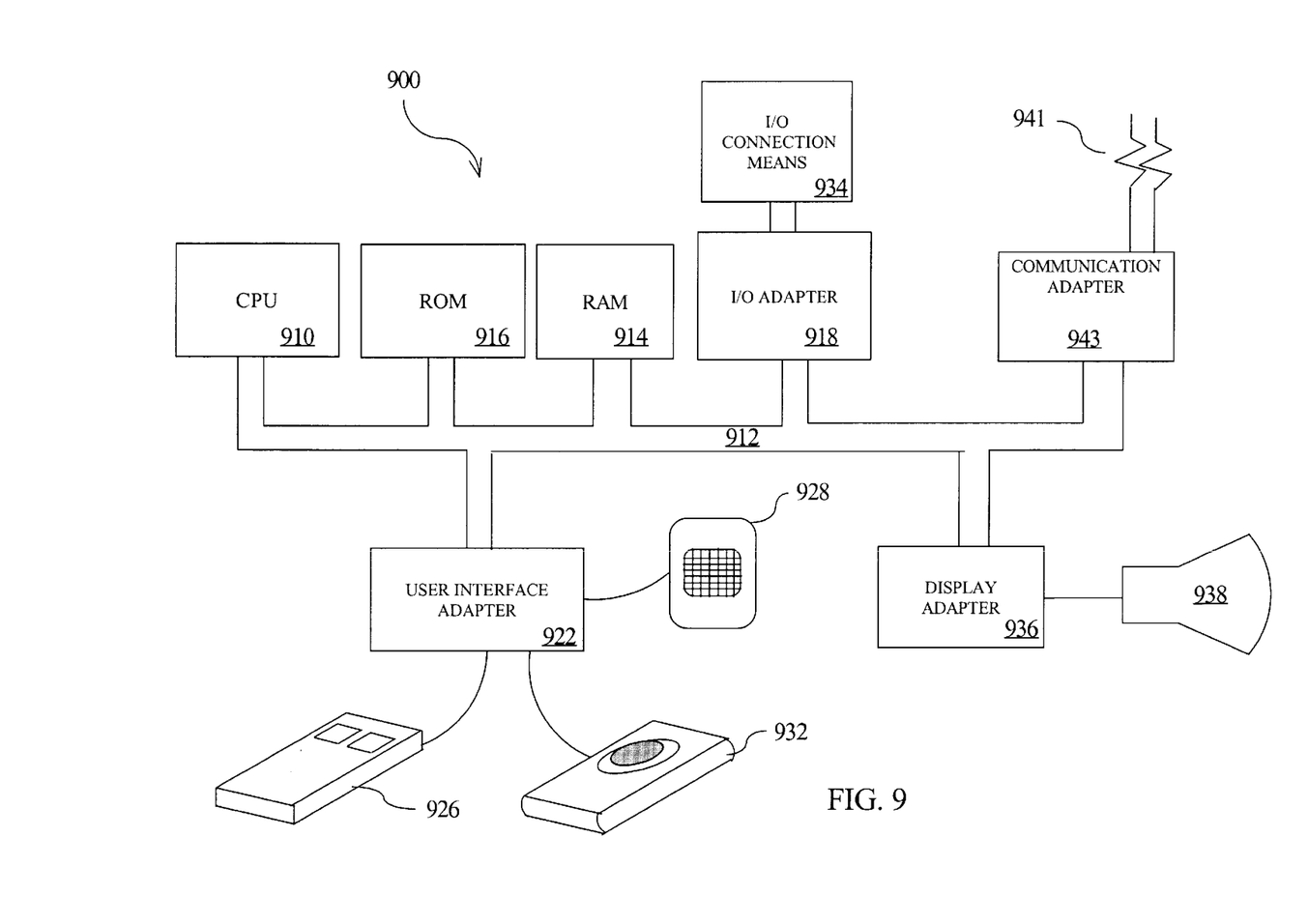
FIG. 9 is a block diagram of a data processing system which may employ method steps according to embodiments of the present invention.

Embodiments of the present invention use a logic characteristic of "carry-look-ahead" and "conditional sum". The logic characteristic of "carry-look-ahead" is used in the sense that the designer does not have to wait for programs (e.g., DRC 104, LVS 105, Boundary Check 106, Compare Blockage 102, or Create Abstract 103) to complete before launching other programs (e.g., Timing Dracula 113 and Noise Dracula 109). In an alternate embodiment of the present invention, if the new extracted timing net list does not affect the timing, the outputs of the previous Pathmill 114 runs are retained. For the case where the outputs of the programs Pathmill 114, Power 117, and Einschk 112 did not previously exist, the scheduler program simply continues submitting these jobs first. For example, if the newly-extracted timing net list does not affect the timing, the scheduler lets the program Pathmill 114, Einschk 112 and Power 117 run to completion. If the newly extracted timing net list does affect the timing, the scheduler program resubmits the programs Pathmill 114, Einschk 112, and Power 117 with the newly extracted timing net list. Boundary Checks, or Error markers are two examples of layout changes that do not affect the timing. Embodiments of the present invention have the characteristic of a "conditional sum" in a sense that depending on the result of its predecessor jobs, a following job is terminated, continued, or rerun Referring to FIG. 9, an example is shown of a data processing system 900 which may use embodiments of the present invention. The system has a central processing unit (CPU) 910, which is coupled to various other components by system bus 912. Read-Only Memory ("ROM") 916 is coupled to the system bus 912 and includes a basic input/output system ("BIOS") that controls certain basic functions of the data processing system 900. Random Access Memory ("RAM") 914, I/O adapter 918, and communications adapter 934 are also coupled to the system bus 912. I/O adapter 918 may be a small computer system interface ("SCSI") adapter that communicates with a disk storage device 920 and/or a tape storage device 940. A communications adapter 934 may also interconnect bus 912 with an outside network 941 enabling the data processing system 900 to communicate with other such systems. Input/Output devices are also connected to system bus 912 via user interface adapter 922 and display adapter 936 Keyboard 924, trackball 932, mouse 926, and speaker 928 are all interconnected to bus 912 via user interface adapter 922. Display 938 is connected to system bus 912 and display adapter 936. In this manner, a user is capable of inputting to the data processing system 900 through the keyboard 924, trackball 932, or mouse 926, and receiving output from the system via speaker 928, and display 938. Data processing system 900 may employ software which employs methods used in embodiments of the present invention.

The methods used in embodiments of the present invention frees the designer from having to keep track of the running of various VLSI layout design jobs. If the whole design process needs to be rerun due to small changes in the layout, cell libraries, checking data, or time-stamp of these programs, the designer just needs to "click one button". The VLSI design process should rerun with an error free completion of the jobs. The methods disclosed in embodiments of the present invention also speed up the process of running the design verification because as many jobs as possible are run in parallel. Program state execution is determined by the rules that the program and logic routine states used by the program scheduler 701 to transition between the various program and logic routine states in the VLSI layout design process.

Although the present invention and its advantages have been described in detail, it should be understood that various changes, substitutions and alterations can be made herein without departing from the spirit and scope of the invention as defined by the appended claims.

What is claimed is:

1. An Integrated Circuit (IC) layout design method, said IC layout design method having a set of layout design programs and an initial layout database describing said an IC layout, said IC layout design method comprising the steps of:

(a) organizing said set of layout design programs as executable program states, each of said program states generating program output data and program logic outputs and receiving program logic inputs and program input data, said program input data selected from said layout database;

(b) coupling said executable program states with a program scheduler, said program scheduler receiving from each of said executable program states, said program logic outputs and program output data and generating and sending to each of said executable program states said program logic inputs and program input data, said program scheduler further receiving designer control signals and receiving data from said layout database and updating said layout database data in response to said designer control signals and said program logic outputs and said program output data;

(c) starting execution of selected program states from said set of program states, concurrently, in response to said designer control signals and said program logic inputs;

(d) completing said selected program states and starting additional program states unless stopped by said program scheduler in response to said program logic outputs;

(e) determining if all program states in said set of program states have completed successfully, stopping said layout design if all programs have completed successfully and sending designer action data to a designer if all programs have not completed successfully;

(f) correcting said layout database by said designer if all programs have not completed successfully; and (g) repeating said method steps (c)–(f) in response to one or more of said designer control signals wherein said designer control signals comprise a start Program Scheduler, set to execute in an Audit Mode in which all program states must complete error free, and a stop Program Scheduler.

2. The method of claim 1, wherein said executable program states are distributed in different program execution units.

3. The method of claim 1, wherein said executable program states and said program scheduler are coupled and communicate said program input and output data and said program logic inputs and outputs in a network.

4. The method of claim 1, wherein said program output data is used to verify or update said IC layout.

5. The method of claim 1, wherein said program logic outputs comprise an execution completed with errors signal, an execution completed without errors signal and an execution not completed signal.

6. The method of claim 1, wherein said program logic inputs comprise a stop program state execution signal, a start program state execution signal, a complete program state execution signal, and a tag program output data as conditional with errors signal.

7. The method of claim 1, wherein said program scheduler stops program state executions on a program state error in response to a designer control or in response to a program logic output.

8. The method of claim 1, wherein conditions for successfully completing a program state execution are modified in response to said designer controls.

9. The method of claim 1, wherein said designer action data comprises identification data indicating which data in said layout database is in error and needs correction.

10. The method of claim 1, wherein said designer controls comprise a set to execute in a Non-Audit Mode in which program states may complete conditionally and program output data may be tagged as conditional with errors.

11. A computer program product for an Integrated Circuit (IC) layout design method, said IC layout design method having a set of layout design programs and an initial layout database describing an IC layout, said computer program product embodied in a machine readable medium, including programming for a processor, said computer program comprising a program of instructions for performing the program steps of:

(a) organizing said set of layout design programs as executable program states, each of said program states generating program output data and program logic outputs and receiving program logic inputs and program input data, said program input data selected from said layout database;

(b) coupling said executable program states with a program scheduler, said program scheduler receiving said program logic outputs, program output data and generating said program logic inputs and program input data in response to designer control signals and said program logic outputs;

(c) starting execution of selected program states from said set of program states, concurrently, in response to said designer control signals and said program logic inputs and completing said selected program states and starting additional program states unless stopped by said program scheduler;

(d) correcting said layout database if all program states have not completed successfully and stopping said layout design if all program states have completed successfully;

(e) repeating said method steps (c) and (d) in response to one or more of said designer control signals wherein said designer control signals comprise a start Program Scheduler, a set to execute in an Audit Mode in which all program states must complete error free, and a stop Program Scheduler.

12. The computer program product of claim 11, wherein said executable program states are distributed in different program execution units.

13. The computer program product of claim 11, wherein said executable program states and said program scheduler are coupled and communicate said program input and output data and said program logic inputs and outputs in a network.

14. The computer program product of claim 11, wherein said program output data is used to verify or update said IC layout.

15. The computer program product of claim 11, wherein said program logic outputs comprise an execution completed with errors signal, an execution completed without errors signal, and an execution not completed signal.

16. The computer program product of claim 11, wherein said program logic inputs comprise a stop program state execution signal, a start program state execution signal, a complete program state execution signal, and a tag program output data as conditional with errors signal.

17. The computer program product of claim 11, wherein said program scheduler stops program state executions in response to a program state error, in response to a designer control, or in response to a program logic output.

18. The computer program product of claim 11, wherein conditions for successfully completing a program state execution are modified in response to said designer controls.

19. The computer program product of claim 11, wherein said designer action data comprises identification data indicating which data in said layout database is in error and needs correction.

20. The computer program product of claim 11, wherein designer controls comprise a set to execute in Non-Audit Mode in which program states may complete conditionally and program output data may be tagged as conditional with errors.

21. A data processing system, comprising:

a central processing unit (CPU);

shared random access memory (RAM);

read only memory (ROM);

an I/O adapter;

a display adapter;

a display; and a bus system coupling devices internal to said CPU, said CPU having layout circuitry for generating for an Integrated Circuit layout said layout circuitry having a set of layout design circuits and a storage circuit for storing an initial layout database describing IC layout, said layout circuitry further comprising:

circuitry for organizing a set of layout design circuits as executable program states, wherein selected layout design circuits in each of said executable program states generate program output data and program logic outputs and receive program logic inputs and program input data, said program input data selected from said layout database;

circuitry for coupling said executable program states with a scheduler circuit, said scheduler circuit receiving said program logic outputs, said program output data and generating said program logic inputs and said program input data in response to designer control signals and said program logic outputs;

circuitry for concurrently starting execution of selected of said executable program states from said set of program states in response to said designer control signals and said program logic inputs and completing said selected program states and starting additional program states unless stopped by said scheduler circuit;

circuitry for correcting said layout database if all of said executable program states have not completed successfully and stopping executing said layout circuitry if all of said program states have completed successfully;

circuitry for repeating said executable program states in response to one or more of said designer control signals wherein said one or more designer control signals comprise a start scheduler circuit, a set execution mode to an Audit Mode in which all program states must complete error free, and a stop said scheduler circuit.

22. The data processing system of claim 21, wherein said program logic outputs comprise an execution completed with errors signal, an execution completed without errors signal, and an execution not completed signal.

23. The data processing system of claim 21, wherein said program logic inputs comprise a stop program state execution signal, a start program state execution signal, complete program state execution signal, and a tag program output data as conditional with errors signal.

24. The data processing system of claim 21, wherein said designer control signals comprise a start said scheduler circuit, a set to execute in a Non-Audit Mode in which program states may complete conditionally and program output data may be tagged as conditional with errors, and a stop said scheduler circuit.

25. The data processing system of claim 21, wherein said scheduler circuit stops program state executions in response to a program state error, in response to a designer control, or in response to a program logic output.

26. The data processing system of claim 21, wherein conditions for successfully completing a program state execution are modified in response to said designer controls.

* * * * *

UNITED STATES PATENT AND TRADEMARK OFFICE
CERTIFICATE OF CORRECTION

PATENT NO. : 6,647,536 B2
DATED : November 11, 2003
INVENTOR(S) : Douglas Hooker Bradley and Tai Anh Cao It is certified that error appears in the above-identified patent and that said Letters Patent is hereby corrected as shown below:

Column 11,
Line 1, following "describing" please delete "said".
Line 38, following "Scheduler" please delete ",".
Line 39, following "free" please delete ",".

Column 12,
Line 38, following "Scheduler" please delete ",".
Line 39, following "free" please delete ",".

Column 14,
Line 23, before "complete" please insert -- a --.
Line 24, following "signal" please delete ",".
Line 27, following "comprise" please insert -- , --.

Signed and Sealed this

Twenty-second Day of June, 2004

JON W. DUDAS
*Acting Director of the United States Patent and Trademark Office*